United States Patent

[11] 3,588,475

[72] Inventor John E. Scott
Rego Park, N.Y.
[21] Appl. No. 809,339
[22] Filed Mar. 21, 1969
[45] Patented June 28, 1971
[73] Assignee The United States of America as represented by the Secretary of the Navy

[54] FORWARD-BACKWARD DIGITAL COUNTER CIRCUIT
2 Claims, 2 Drawing Figs.

[52] U.S. Cl. .......... 235/92EV, 235/92CM, 235/92LG
[51] Int. Cl. .......... H03k 21/16, H03k 21/06
[50] Field of Search .......... 235/92

[56] References Cited

UNITED STATES PATENTS 3,151,252 9/1964 Leightner .......... 307/88.5
3,423,576 1/1969 Abe .......... 235/92

*Primary Examiner*—Maynard R. Wilbur
*Assistant Examiner*—Robert F. Gnuse
*Attorneys*—Edgar J. Brower and H. H. Losche

ABSTRACT: A simplified reversible digital counting circuit having components of a J-K flip-flop, an OR gate, and an inhibit gate for each bit or stage of the counter with an input of pulses to be counted and selective inputs of complementary signals and complementary-preset signals to provide forward and backward count of the count pulses on the input.

INVENTOR
JOHN E. SCOTT

BY H. H. Losche

ATTORNEY

FORWARD-BACKWARD DIGITAL COUNTER CIRCUIT

BACKGROUND OF THE INVENTION

This invention relates to reversible digital counter circuits and more particularly to counter circuits of minimum parts to provide the greatest counting speed which allows simplification of upper and lower limit detection logic.

The prior art, illustrated in general in one of the FIGS. of drawing, reveals the complexity of AND, OR, inhibiting, and other gates and accompanying circuits required to produce ripple-carry, backward-forward count. This complexity also inherently necessitates time for carry propagation through the gates and for switching the flip-flop or multivibrator circuits. The more the complexity of the counter circuits, the greater the probability of fault to produce inaccurate results.

SUMMARY OF THE INVENTION

In the present invention a single J–K flip-flop circuit with an OR gate and an inhibit gate make up each stage of a counter circuit. The only input needed for the forward count is the input for the pulses to be counted. For backward count an input to the OR gates of complementary signals and an input to the inhibit gate of complementary preset signals are necessary. The zero or "0" output of each stage is coupled as the trigger input to the next succeeding stage and the J and K inputs are coupled to an enabling voltage. This simple coupling of a minimum of parts provides a forward-backward digital counter for as many stages or bits as required or desired. It is therefore a general object of this invention to provide a reversible digital ripple-through counter of only three elements per stage to produce accurate forward and backward count.

BRIEF DESCRIPTION OF THE DRAWINGS

These and other objects and the attendant advantages, features, and uses of the invention will become more apparent to those skilled in the art as a more detailed description proceeds when considered along with the accompanying drawing in which.

DESCRIPTION OF A PRIOR ART DEVICE

Figure 1:
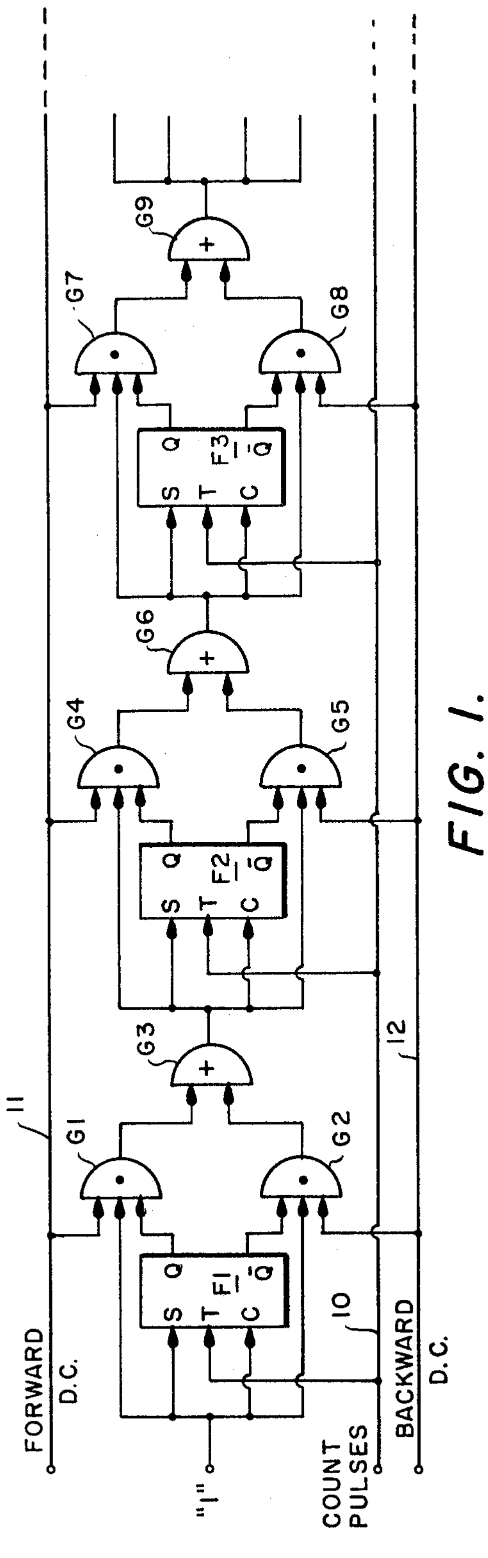
FIG. 1. (PRIOR ART)
FIG. 1 is a circuit and block schematic of a digital counting device representative of the prior art.

Referring more particularly to FIG. 1, which in general represents the prior art of reversible digital counters, there is illustrated three stages of a multiple stage digital counter, each stage consisting of a bistable multivibrator or flip-flop circuit with two AND gates and an OR gate. The first stage or bit counter consists of the flip-flop F1, AND gates G1 and G2, and the OR gate G3. The second stage consists of F2, G4, G5, and G6, and so on throughout the succeeding stages required in the total counter. The counter circuit in each flip-flop, such as F1, has an output Q coupled as one input to AND gate G1 and a $\overline{Q}$, or not Q, output coupled as one input to the AND gate G2. The Q output represents a "1" output while the output $\overline{Q}$ represents the "0" output. A pulse source to be counted is applied to the conductor means 10 which is applied to the T terminal in each of the flip-flop circuits F1, F2, etc. The conductor 11 has a direct current (DC) voltage selectively applied thereto to produce a forward count of the counter, the conductor 11 being coupled respectively as one input to each of the AND gates G1, G4, G7, etc., throughout the plurality of counter stages. In like manner a conductor 12 conducts a backward count DC voltage, which voltage is applied as one input to each of the AND gates G2, G5, G8, etc., of the plurality of counter stages. In the first stage "1" voltage is applied as a third input to AND gate G1 and a third input to AND gate G2 as well as to the S and C terminals of the flip-flop F1. The output of the AND gate G1 is coupled as one input to OR gate G3 while the output of the AND gate G2 is coupled as a second input to the OR gate G3. The output of the OR gate G3 is coupled in common as the third input to AND gate G4, as the third input to AND gate G5, and to the terminals S and C of the flip-flop circuit F2. The coupling just described for the second stage of the counter is repeated in succeeding stages for the output of the OR gates G6, G9, etc.

It may be readily recognized from this prior device that a forward count is accomplished when the forward DC signal is applied over conductor 11 and count pulses are applied over the conductor 10. F1 will trip to the opposite output form the one it is in with each pulse. The second stage F2 will trip to its opposite state whenever F1 is in its Q output state and a count pulse is applied. The third stage flip-flop F3 will trip to its opposite state whenever F2 is in its Q output state and a count pulse is applied. For example, at the beginning of the count with all stages in their $\overline{Q}$ output state, the first pulse will shift F1 to Q making a readout of one count. For the second pulse F1 will return to $\overline{Q}$ and F1 will change to the Q output state for a readout of two. For the third count F1 will go to the Q output state to produce a readout of three. For the fourth count pulse F1 will return to the $\overline{Q}$ output, F2 will return to the $\overline{Q}$ output, and F3 will go to the Q output for a readout of four. This sequence of count pulses will produce an addition, as well understood by those skilled in the art.

For a backward count of the device in FIG. 1 let it be assumed that the counter is pulsed for a six count which places F1 in the $\overline{Q}$ state, F2 in the Q state, and F3 in the Q state. No voltage is applied over the conductor 11 but the backward DC voltage is applied over conductor 12. For the first subtracting pulse over conductor 10, F1 will go to the Q state and F2 will go the the $\overline{Q}$ state since S and C terminals of F2 had a "1" voltage from AND gate G2. This will represent a readout of five, or 6—1. A second subtracting pulse count over the conductor 10 will return F1 to the $\overline{Q}$ state producing a count output of four representative of the 6—2 given in the problem. Such a subtracting count will proceed until it counts to zero. Accordingly, this is the simplest counter known in the prior art to count forward and backward.

DESCRIPTION OF THE PREFERRED EMBODIMENT

Figure 2:
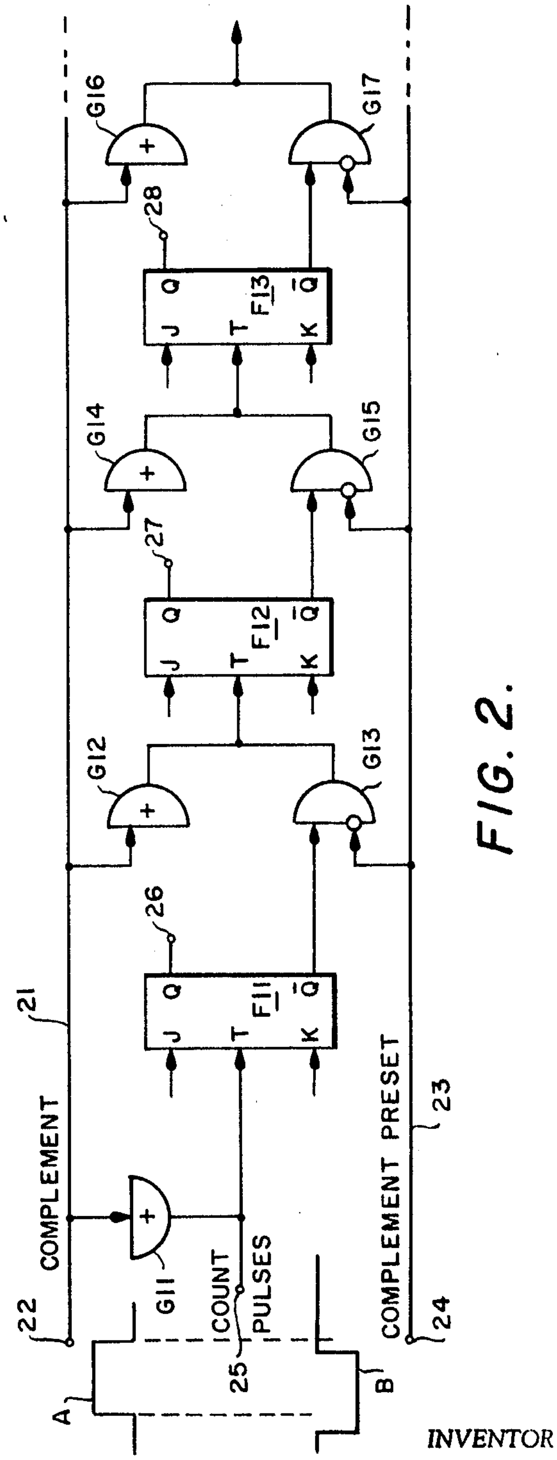
FIG. 2 is a simple circuit schematic and block diagram of a reversible ripple through digital counter of this invention.

Referring more particularly to FIG. 2, each stage of the reversible counter consists of a J–K flip-flop circuit such as F11, F12, and F13, respectively, with two gates, gates G12, G14, and G16, respectively, being OR gates and gates G13, G15, and G17, respectively, being inhibit gates. These J–K flip-flop circuits are of the conventional type described in the text "*Logical Design of Digital Computers*" by Montgomery Phistor, Jr., 1958, published by John Wiley & Sons, Pages 128—129 and 134—135. Such a J–K flip-flop is also disclosed in U.S. Pat. No. 3,297,859 of R. R. Reiser. One extra OR gate G11 is required in this counter circuit connecting a conductor 21 on which complement positive pulses are applied over the terminal 22 shown by the pulse A. A complement preset pulse is conducted over the conductor means 23 from terminal 24 providing a negative pulse B shown in this figure. Count pulses are applied to terminal 25 are conducted to the T terminal of the first flip-flop F11 only. The OR gate G11 is coupled between the complement pulse conductor 21 and the count pulse input 25. The conductor 21 is likewise coupled respectively as a single input to each inverter gate G12, G14, G16, etc., for the remaining counter stages. The complement preset conductor 23 is coupled respectively to the inhibit gates G13, G15, G17, etc., for the remaining counter stages. The Q output of flip-flop F11 terminates in the terminal 26, the Q output of F12 terminates in terminal 27, and the Q output of F13 terminates in terminal 28 which terminations are repeated for the remainder of the stages. Terminals 26, 27, 28, etc., can be coupled to a readout indicator, or the like. The $\overline{Q}$ output of F11 is coupled as an input to inhibit gate G13, the $\overline{Q}$ output of F12 is coupled to the inhibit gate G15, the $\overline{Q}$ output of F13 is coupled as an input to the inhibit gate G17 which couples are repeated through the remainder of the counter stages. The counter coupled in the simple manner shown and described will produce a ripple through forward and reverse digital count as more fully described in the operation hereinbelow.

OPERATION OF FIG. 2

Let it be assumed that the counter in FIG. 2 is reset to its "0" state in which case there are $\bar{Q}$ outputs from all stages representative of "O"'s in the counter circuit. The Q outputs, of course, provide the 1 outputs of the counter circuit, as well understood by those skilled in the art. For a forward "0" count logic voltage is applied to the complement conductor 21, and 1 logic voltage is applied to the complement preset conductor 23. The pulses to be counted are applied to terminal 25 and these pulses are counted in the following manner as shown in the TRUTH TABLE I hereinbelow:

TRUTH TABLE I

Forward count

| Pulse | Stage 1 | Stage 2 | Stage 3 | Stage n |
|---|---|---|---|---|
| | 0 | 0 | 0 | |
| 1 | 1 | 0 | 0 | |
| 2 | 0 | 1 | 0 | |
| 3 | 1 | 1 | 0 | |
| 4 | 0 | 0 | 1 | |
| 5 | 1 | 0 | 1 | |
| 6 | 0 | 1 | 1 | |
| 7 | 1 | 1 | 1 | |

For the first counter F11 will switch to the Q output state to provide the digital readout of one. The second pulse will return F11 to $\bar{Q}$ output and F12 will go to the Q output since the $\bar{Q}$ output through inhibit gate G13 ripples through to the T input of F12. Since inhibit gate G13 is not inhibited by any complement preset pulse or voltage, $\bar{Q}$ from F11 is not inhibited to ripple through to the terminal of F12. This produces the digital count of two as shown in the TRUTH TABLE I. For the third pulse on terminal 25, F11 will go to the Q state to provide the digital count three in TRUTH TABLE I. Count 4 will place F11 in $\bar{Q}$ state and F12 in the $\bar{Q}$ state which will ripple through to F13 to place it in the Q state to provide the digital count four in TRUTH TABLE I. As may be seen from this procedure the counter in FIG. 2 will produce the digital count in the stages as shown in the TRUTH TABLE I. This provides forward count or addition for digital numbers pulsed into the counter over the count pulse terminal 25 from a source producing these pulses, as from a keyboard or the like, as is well understood by those skilled in the art.

Now let it be assumed that a subtraction or backward count is to be produced from the counter circuit of FIG. 2. Such backward count will proceed as shown in TRUTH TABLE II hereinbelow:

TRUTH TABLE II

Backward Count

| | Stages | | | Answer (after complement pulse) | | |
|---|---|---|---|---|---|---|
| | 1 | 2 | 3 | | | |
| 7 (Digital count) | 1 | 1 | 1 | | | |
| Complement and complement present pulses | 0 | 0 | 0 | Stage 1 | Stage 2 | Stage 3 |
| (a) Subtract 1 | 1 | 0 | 0 | 0 | 1 | 1 |
| (b) Subtract 2 | 0 | 1 | 0 | 1 | 0 | 1 |
| (c) Subtract 3 | 1 | 1 | 0 | 0 | 0 | 1 |
| (d) Subtract 4 | 0 | 0 | 1 | 1 | 1 | 0 |
| (e) Subtract 5 | 1 | 0 | 1 | 0 | 1 | 0 |
| (f) Subtract 6 | 0 | 1 | 1 | 1 | 0 | 0 |
| (g) Subtract 7 | 1 | 1 | 1 | 0 | 0 | 0 |

Let it first be assumed that the counter in FIG. 2 is resting in its "0" state in which all $\bar{Q}$ outputs are present and it is desired to subtract 3 from 6. 6 is accordingly put into the counter in the same manner it would be for addition in which case F11 would rest in the $\bar{Q}$ state, F12 would rest in the Q state, and F13 would rest in the Q state. For subtraction the complement and complement preset pulses A and B are applied over the conductor means 21 and 23 to present the complement to of the number 6. It may be seen in FIG. 2 that the complement preset pulse B will terminate slightly before the complement pulse A to insure against any double triggering. The complement preset pulse B over conductor 23 inhibits gates G13, G15, G17, etc., throughout the counter allowing the complement pulse over conductor means 21 to switch the digital number 6 to its complement state in which F11 would go to the Q state and F12 and F13 each to the $\bar{Q}$ states as in line (*a*). This is shown in TRUTH TABLE II where I would be subtracted from the 7 count in the three stages. The counter in FIG. 2 will now operate as an adder in the same manner as discussed for TRUTH TABLE I. From 6 we first deduct the first count pulse which will place F11 in the $\bar{Q}$ state, F12 in the Q state, while F13 remains in the $\bar{Q}$ state as in line (b). The second pulse will return F11 to the Q state and F12 and F13 will remain in the same Q and $\bar{Q}$ states, respectively, as in line (*c*). The third subtraction pulse will return F11 to the $\bar{Q}$ state, will return F12 to the Q state, and change F13 to the Q state. Now to finalize the subtraction of *6—3*, a complement pulse and the complement preset pulse is again applied to reverse the state for the counters which will place F11 in the Q state, F12 in the Q state and F13 in the $\bar{Q}$ state for a digital readout of three from the counter circuit as in line (*d*) under "Answer" proving the answer of 6—3=3. It is to be understood that this same counting procedure will result from a plurality of counters for greater digital numbers in the same manner as given in the above example for TRUTH TABLE II.

As may be seen from the above description and description of operation of the reversible counter in FIG. 2, a stage consists of substantially only three components with a minimum of interconnecting couplings from that recognized in prior art devices yet a counter of such stages provides rapid and accurate results of both addition and subtraction.

While many modifications and changes may be made in the constructional details and features of this invention to arrive at similar results in the spirit of this invention, it is to be understood that I desire to be limited in the scope of my invention only by the limits of the appended claims.

I claim:

1. A simple reversible ripple-through digital counter comprising:

a plurality of bistable multivibrators each having an input, a logic "0" output, and a logic "1" output arranged in a series sequence with said input to the first in series constituting the input to receive pulses to be counted;

a plurality of OR gates, each having an input and each having an output coupled respectively to said input of one each bistable multivibrator from the first in series sequence to the last;

a first conductor coupled in parallel to all said OR gate inputs for conducting complement signals thereover;

a plurality of inhibit gates, each having an input coupled respectively to said "0" logic output of the preceding bistable multivibrator in said series, each having an inhibit input, and each having an output coupled respectively to said input of the next succeeding said bistable multivibrator except the first bistable multivibrator in said series, each bistable multivibrator, OR gate, and inhibit gate providing a stage of said counter; and a second conductor for conducting complement-preset signals thereover coupled in parallel to said inhibit inputs of said inhibit gates whereby forward count is accomplished by pulse to be counted being coupled to said input of said first bistable multivibrator and backward count is accomplished by the application of complement signals and complement-preset signals preceding the application of said pulses to be counted with the digital results appearing on said "1" logic outputs of said bistable multivibrators.

2. A simple reversible ripple-through digital counter as set fourth in claim 1 wherein said bistable multivibrators are J-K flip-flop circuits.